(12) United States Patent
Kawamura et al.

(10) Patent No.: US 10,559,339 B2
(45) Date of Patent: Feb. 11, 2020

(54) PERIPHERY FILL AND LOCALIZED CAPACITANCE

(71) Applicant: Micron Technology, Inc., Boise, ID (US)

(72) Inventors: Christopher John Kawamura, Boise, ID (US); Scott James Derner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/189,416

(22) Filed: Nov. 13, 2018

(65) Prior Publication Data

US 2019/0172515 A1 Jun. 6, 2019

Related U.S. Application Data

(63) Continuation of application No. 15/662,002, filed on Jul. 27, 2017, now Pat. No. 10,163,480.

(51) Int. Cl.
| | |
|---|---|
| *G11C 5/10* | (2006.01) |
| *G11C 11/22* | (2006.01) |
| *G11C 11/4074* | (2006.01) |
| *H01L 27/108* | (2006.01) |
| *H01L 27/11507* | (2017.01) |
| *H01L 23/528* | (2006.01) |

(Continued)

(52) U.S. Cl.
CPC ............ *G11C 11/221* (2013.01); *G11C 5/06* (2013.01); *G11C 5/10* (2013.01); *G11C 7/08* (2013.01); *G11C 7/12* (2013.01); *G11C 11/2253* (2013.01); *G11C 11/2297* (2013.01); *G11C 11/408* (2013.01); *G11C 11/4074* (2013.01); *G11C 11/4091* (2013.01); *G11C 11/4094* (2013.01); *H01L 23/528* (2013.01); *H01L 27/10805* (2013.01); *H01L 27/11507* (2013.01)

(58) Field of Classification Search
CPC ..................................... G11C 5/10; G11C 5/06
USPC ...................................................... 365/65, 63
See application file for complete search history.

(56) References Cited

U.S. PATENT DOCUMENTS

| | | |
|---|---|---|
| 5,373,463 A | 12/1994 | Jones, Jr. |
| 5,745,402 A | 4/1998 | Arase |

(Continued)

OTHER PUBLICATIONS

ISA/KR, International Search Report and Written Opinion of the International Search Authority, Int'l. Appl. No. PCT/US2018/042931, dated Nov. 19, 2018, Korean Intellectual Property Office, Seo-gu, Daejeon, Republic of Korea, 12 pgs.

(Continued)

*Primary Examiner* — Son L Mai
(74) *Attorney, Agent, or Firm* — Holland & Hart LLP

(57) ABSTRACT

Methods, systems, and devices for periphery fill and localized capacitance are described. A memory array may be fabricated with certain containers connected to provide capacitance rather than to operate as memory cells. For example, a memory cell having one or two transistors, or other switching components, and one capacitor, such as a ferroelectric or dielectric capacitor, may be electrically isolated from one or more containers sharing a common access line, and the isolated containers may be used as capacitors. The capacitors may be used for filtering in some examples. Or the capacitance may be used to boost or regulate voltage in, for example, support circuitry.

14 Claims, 10 Drawing Sheets

(51) Int. Cl.
  *G11C 11/408*  (2006.01)
  *G11C 7/08*  (2006.01)
  *G11C 7/12*  (2006.01)
  *G11C 11/4091*  (2006.01)
  *G11C 11/4094*  (2006.01)
  *G11C 5/06*  (2006.01)

(56) References Cited

U.S. PATENT DOCUMENTS

| | | |
|---|---|---|
| 5,969,380 A | 10/1999 | Seyyedy |
| 5,969,979 A | 10/1999 | Hirano |
| 5,995,406 A | 11/1999 | Kraus et al. |
| 6,191,990 B1 | 2/2001 | Itoh et al. |
| 6,256,220 B1 | 7/2001 | Kamp |
| 6,285,573 B1 | 9/2001 | Park |
| 6,297,624 B1 | 10/2001 | Mitsui et al. |
| 6,979,849 B2 | 12/2005 | Lane |
| 7,459,362 B2 | 12/2008 | Juengling |
| 7,944,732 B2 | 5/2011 | de Jong et al. |
| 9,390,781 B2 | 7/2016 | Matsuura |
| 9,768,181 B2 | 9/2017 | Chavan et al. |
| 9,922,716 B2 | 3/2018 | Hsiung et al. |
| 10,032,496 B1 | 7/2018 | Bedeschi et al. |
| 2002/0159307 A1 | 10/2002 | Hasegawa et al. |
| 2005/0248996 A1 | 11/2005 | Schneider et al. |
| 2008/0273311 A1 | 11/2008 | Biunno |
| 2008/0298139 A1 | 12/2008 | Fisch et al. |
| 2011/0317507 A1 | 12/2011 | Nakazawa |
| 2012/0243298 A1 | 9/2012 | Hush |
| 2015/0311217 A1* | 10/2015 | Chavan ............ H01L 27/11507 257/295 |
| 2016/0111138 A1 | 4/2016 | Izumi et al. |

OTHER PUBLICATIONS

ISA/KR, International Search Report and Written Opinion of the International Search Authority, Int'l. Appl. No. PCT/US2018/043521, dated Oct. 29, 2018, Korean Intellectual Property Office, Seo-gu, Daejeon, Republic of Korea, 10 pgs.

* cited by examiner

PERIPHERY FILL AND LOCALIZED CAPACITANCE

CROSS REFERENCE

The present Application for Patent is a continuation of U.S. patent application Ser. No. 15/662,002, by Kawamura et al., entitled "Periphery Fill and Localized Capacitance," filed Jul. 27, 2017, assigned to the assignee hereof, and is expressly incorporated by reference in its entirety herein.

BACKGROUND

The following relates generally to operating a memory array and more specifically to periphery fill and localized capacitance.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. Unnecessary or avoidable process steps may lead to increased manufacturing costs. Fabricating additional components on a memory chip may affect other metrics, such as power consumption, latency, or the like, particularly if those additional components are fabricated in a manner that occupies portions of the chip that could otherwise be usable for memory functions. It may therefore be advantageous to avoid fabricating ancillary components on the memory chip when possible.

DETAILED DESCRIPTION

A memory device may be fabricated with ancillary components, such as capacitors, with few or no additional process steps beyond those used to fabricate the memory cells of the device. Capacitors, for example, may be formed in the same type of container as memory cells of the array, and they may be formed in the same or approximately the same plane as cells of the array. The capacitors may be coupled to access lines of the array and electrically isolated from cells of the array. The capacitors may occupy containers that would otherwise be unsuitable or not preferable for memory cells thus taking advantage of otherwise unused portions of a memory chip while still providing capacitance for bus stabilization, filtering, voltage boosting, or the like. In some examples, the capacitance may be used to boost or regulate voltage in, for example, support circuitry. This may make capacitance available to improve chip or array operation without increasing die size of the array.

Features of the disclosure introduced above are further described below in the context of a memory array. Specific examples are then described for a memory array that supports periphery fill and localized capacitance. These and other features of the disclosure are further illustrated by and described with reference to apparatus diagrams, system diagrams, and flowcharts that relate to periphery fill and localized capacitance. The disclosure may relate to any non-volatile memory. Although some examples are discussed with reference to a ferroelectric capacitor, the present disclosure is not limited to ferroelectric memories.

Figure 1:
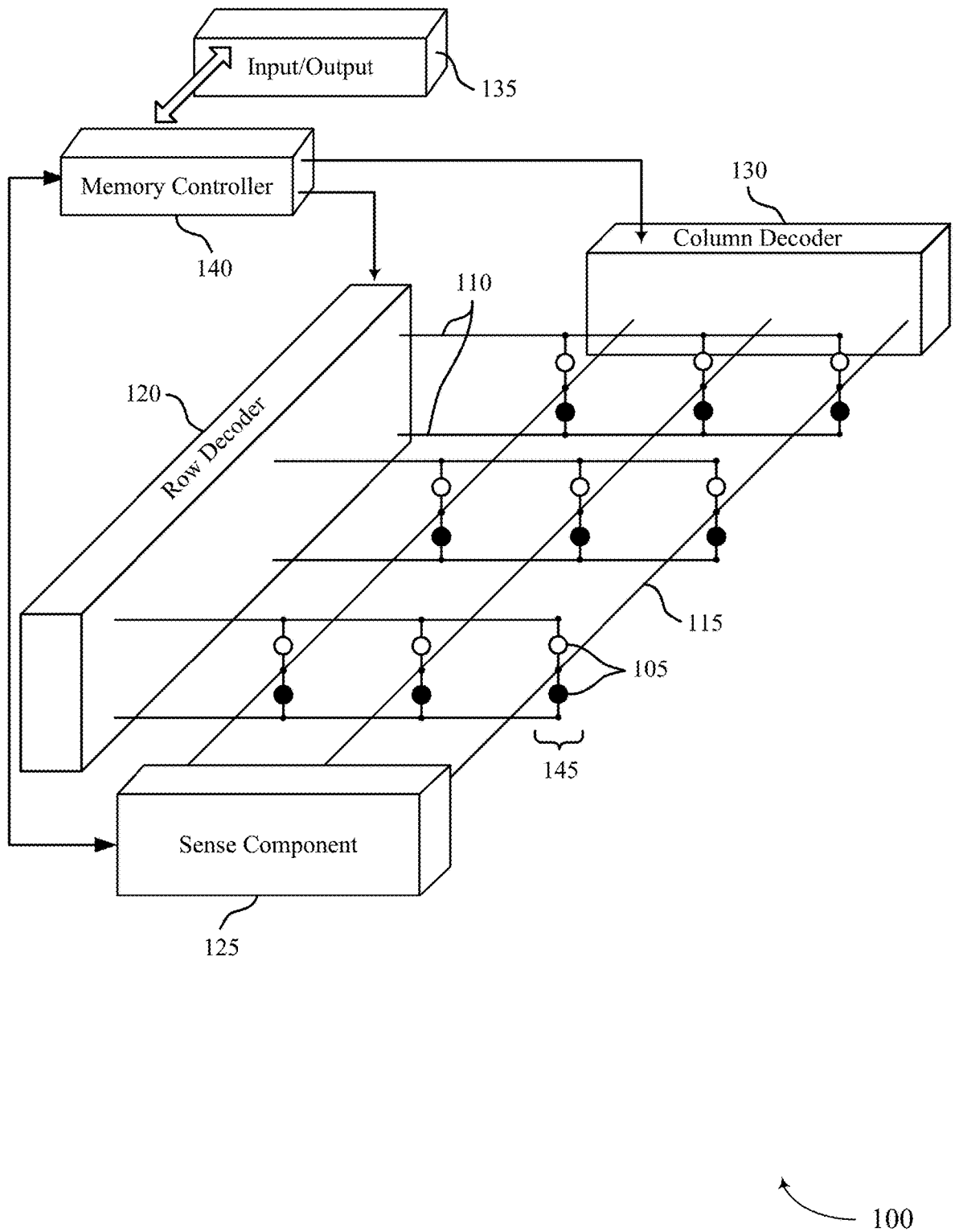
FIG. 1 illustrates an example memory device that supports features and operations in accordance with examples of the present disclosure.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting access line 110 and digit line 115. Access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both.

A 3D memory array may include two-dimensional (2D) memory arrays formed on top of one another. This may increase the number of memory cells that may be placed or created on a single die or substrate as compared with 2D arrays, which in turn may reduce production costs or increase the performance of the memory array, or both. Memory array 100 may include any number of levels. Each level may be aligned or positioned so that memory cells 105 may be approximately aligned with one another across each level. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145. Each memory cell 105 may include a selector device and a memory element in electronic communication with a first access line. In some examples, each memory cell 105 may be in electronic communication with a first segment of the first access line. At least one capacitor may be formed in the container type common to the array and may be coupled with access lines of the array. The capacitor may be electrically isolated from memory cell 105. In some examples, each memory cell 105 may contain multiple selector devices such that memory cell 105 may be coupled with a second access line. In some examples, each memory cell 105 may be in electronic communication with a first segment of the second access line. In some examples, at least one memory cell 105 of the array of memory cells 105 and each capacitor of the plurality of capacitors may be coupled with a second access line.

Each row of memory cells 105 may be connected to an access line 110, and each column of memory cells 105 may be connected to a bit line 115. Access lines 110 and bit lines 115 may be substantially perpendicular to one another to create an array. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share a access line 110 with a lower layer. In general, one memory cell 105 may be located at the intersection of two conductive lines such as a access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105. Similarly, each memory cell 105 may include a selector device and a memory element in electronic communication with a first access line. In some examples, each memory cell 105 may be in electronic communication with a first segment of a first access line. At least one capacitor may be formed in the container type common to the array and may be coupled with access lines of the array. In some examples, each capacitor may be in electronic communication with a second segment of a first access line. Each memory cell may be in electronic communication with a first access line (e.g., access line 110). Access line 110 may be configured such that the capacitor may be electrically isolated from memory cell 105.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting access line 110 and digit line 115. Access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. Each memory cell 105 may contain at least one selector device and a memory element, which may be formed in a container type common to an array that includes the memory cell. Word line 110 may be connected to each of the selection components such that each memory cell may be electrically isolated from a capacitor formed in the container type common to the array and coupled with word line 110. Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the total threshold voltage of the memory cell 105.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. Memory cell 105 may contain multiple selector devices. Each selector device may be a transistor or a thin-film transistor (TFT). Each gate of each transistor may be coupled to a voltage source such that a corresponding charge may be stored in memory cell 105. Additionally or alternatively, for example, each gate of each transistor may be hardwired to a voltage source. The corresponding charge may represent logic "0" or logic "1."

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures. For example, FeRAM may offer comparable read/write speeds as DRAM but may be non-volatile and allow for increased cell density.

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Further, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Further, for example, memory controller 140 may be in electronic communication with each of the plurality of capacitors, as described above. Each of the plurality of capacitors may represent a separate memory cell (e.g., memory cell 105) and each of the plurality of capacitors may each be in electronic communication with a plurality of segments of each of the first access line and the second access line. Memory controller 140 may be operable to access each memory cell from the array of memory cells (e.g., memory array 100) that is in electronic communication with a first access line (e.g., access line 110) and support circuitry. Memory controller 140 may be further operable to capacitively couple a node (e.g., filter a voltage at a node) in the support circuitry with at least one capacitor that is in electronic communication with the first access line while accessing the memory cell, where the memory cell and the at least one capacitor are electrically isolated from one another, and where the at least one capacitor comprises and the memory cell comprise a same container type.

Figure 2:
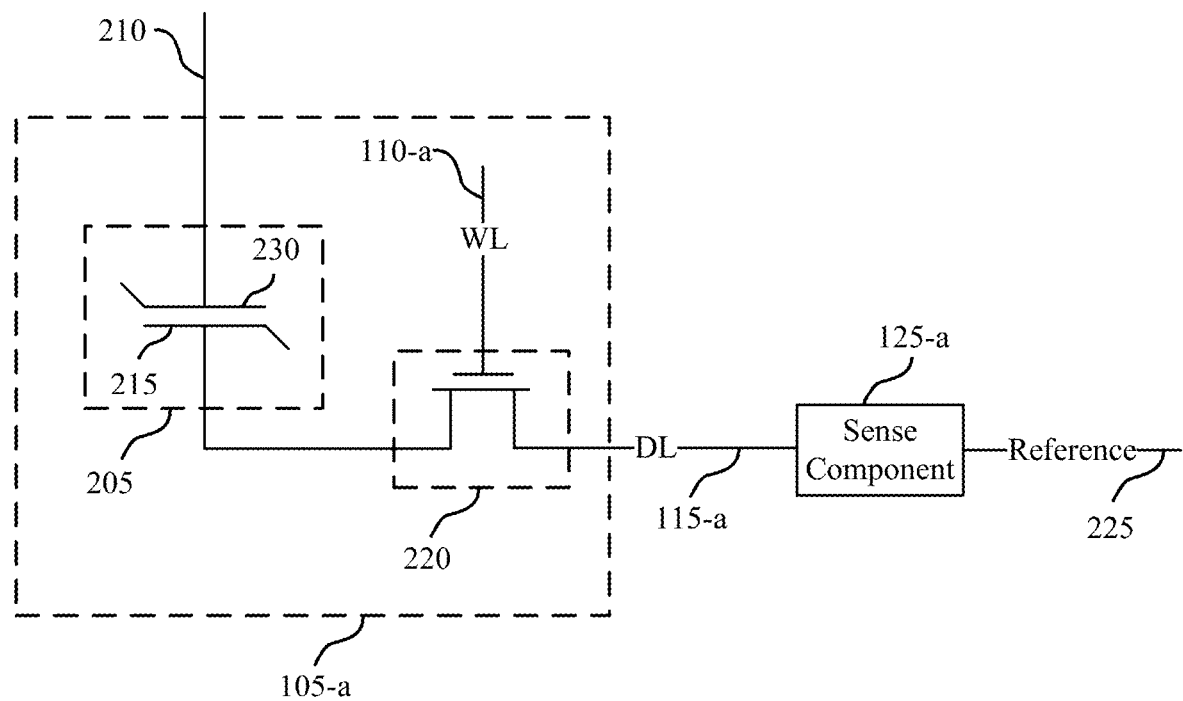
FIG. 2 illustrates an example circuit diagram that supports features and operations in accordance with examples of the present disclosure.

FIG. 2 illustrates an example circuit 200 that supports periphery fill and localized capacitance in accordance with various embodiments of the present disclosure. Circuit 200 includes memory cell 105-*a* that may include at least one selector device and a memory element formed in a container type common to an array that includes memory cell 105-*a*. Memory cell 105-*a* may be an example of memory cell 105 as described with reference to FIG. 1. Circuit 200 may also include a word line 110-*a*, digit line 115-*a*, and sense component 125-*a*, which may be examples of word line 110, digit line 115, and sense component 125, respectively, as described with reference to FIG. 1. Memory cell 105-*a* may include a logic storage component, such as capacitor 205 that has a first plate, cell plate 230, and a second plate, cell bottom 215.

An array or device of which circuit 200 is part of may include one or more additional capacitors that may be formed in a container type common to the array. The one or more additional capacitors (not illustrated) may be electrically isolated from memory cell 105-*a*. The one or more additional capacitors may have a ferroelectric material or a linear dielectric material. Ferroelectric material may have certain properties that are useful for memory components, as described herein, and such materials may be leveraged to provide capacitance to portions of circuit 200 or other portions of the array of which circuit 200 is a part.

The following examples and discussion made with reference to circuit 200 and FIG. 2 may provide additional context for understanding an exemplary array, such as that depicted in FIG. 1. Cell plate 230 and cell bottom 215 may be capacitively coupled through a ferroelectric material positioned between them. The orientation of cell plate 230 and cell bottom 215 may be flipped without changing the operation of memory cell 105-*a*. Circuit 200 may also include selection component 220 and reference line 225. Cell plate 230 may be accessed via plate line 210 and cell bottom 215 may be accessed via digit line 115-*a*. As described above, various states may be stored by charging or discharging capacitor 205.

The stored state of capacitor 205 may be read or sensed by operating various elements represented in circuit 200. Capacitor 205 may be in electronic communication with digit line 115-*a*. For example, capacitor 205 can be electrically isolated from digit line 115-*a* when selection component 220 is deactivated, and capacitor 205 can be connected to digit line 115-*a* when selection component 220 is activated. Activating selection component 220 may be referred to as selecting memory cell 105-*a*. In some cases, selection component 220 is a transistor or a TFT and its operation is controlled by applying a voltage to the transistor gate, where the voltage magnitude is greater than the threshold magnitude of the transistor. Word line 110-*a* may activate selection component 220; for example, a voltage applied to word line 110-*a* is applied to the transistor gate.

In other examples, the positions of selection component 220 and capacitor 205 may be switched, such that selection component 220 is connected between plate line 210 and cell plate 230 and such that capacitor 205 is between digit line 115-*a* and the other terminal of selection component 220. In this embodiment, selection component 220 may remain in electronic communication with digit line 115-*a* and may be electrically isolated from capacitor 205. For example, capacitor 205 can be electrically isolated from digit line 115-*a* when selection component 220 is deactivated, and capacitor 205 can be connected to digit line 115-*a* when selection component 220 is activated. This configuration may be associated with alternative timing and biasing for read and write operations.

Due to the ferroelectric material between the plates of capacitor 205, and as discussed in more detail below, capacitor 205 may not discharge upon connection to digit line 115-*a*. In one scheme, to sense the logic state stored by ferroelectric capacitor 205, word line 110-*a* may be biased to select memory cell 105-*a* and a voltage may be applied to plate line 210. In some cases, digit line 115-*a* is virtually grounded and then isolated from the virtual ground, which may be referred to as "floating," prior to biasing plate line 210 and word line 110-*a*. Biasing plate line 210 may result in a voltage difference (e.g., plate line 210 voltage minus digit line 115-*a* voltage) across capacitor 205. The voltage difference may yield a change in the stored charge on capacitor 205, where the magnitude of the change in stored charge may depend on the initial state of capacitor 205— e.g., whether the initial state stored a logic 1 or a logic 0. This may cause a change in the voltage of digit line 115-*a* based on the charge stored on capacitor 205. Operation of memory cell 105-*a* by varying the voltage to cell plate 230 may be referred to as "moving cell plate."

The change in voltage of digit line 115-*a* may depend on its intrinsic capacitance. That is, as charge flows through digit line 115-*a*, some finite charge may be stored in digit line 115-*a* and the resulting voltage depends on the intrinsic capacitance. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of picofarads (pF)). The resulting voltage of digit line 115-*a* may then be compared to a reference (e.g., a voltage of reference line 225) by sense component 125-*a* in order to determine the stored logic state in memory cell 105-*a*. Other sensing processes may be used.

Sense component 125-*a* may include various transistors or amplifiers to detect and amplify a difference in signals, which may be referred to as latching. Sense component 125-*a* may include a sense amplifier that receives and compares the voltage of digit line 115-*a* and reference line 225, which may be a reference voltage. The sense amplifier output may be driven to the higher (e.g., a positive) or lower (e.g., negative or ground) supply voltage based on the comparison. For instance, if digit line 115-*a* has a higher voltage than reference line 225, then the sense amplifier output may be driven to a positive supply voltage. In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. Alternatively, if digit line 115-*a* has a lower voltage than reference line 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as output 135 as described with reference to FIG. 1.

To write memory cell 105-*a*, a voltage may be applied across capacitor 205. Various methods may be used. In one example, selection component 220 may be activated through word line 110-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high.

Figure 3:
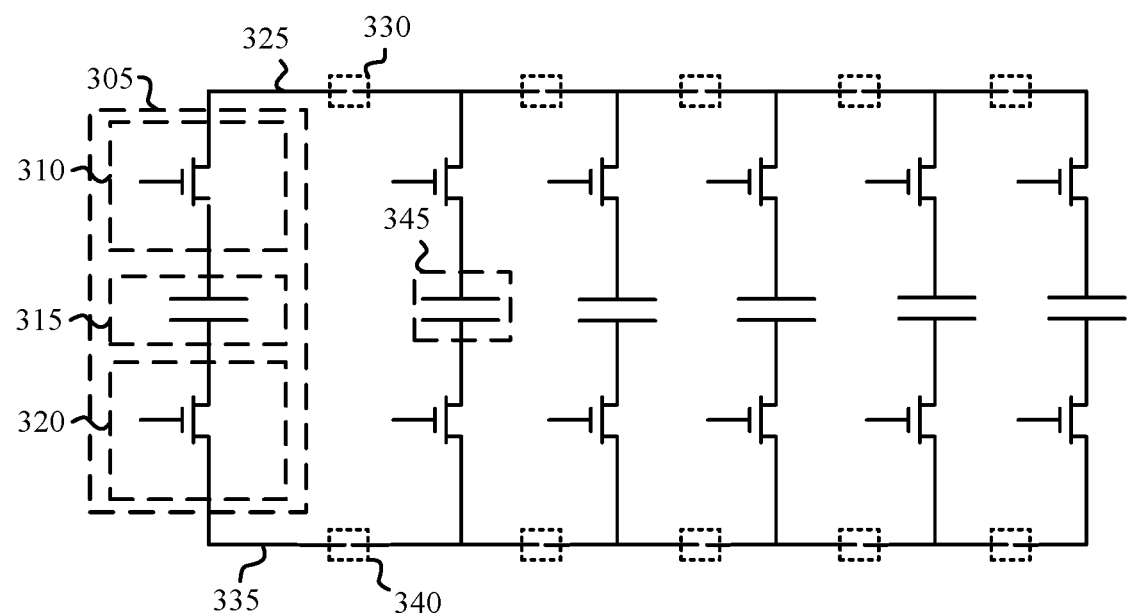
FIG. 3 illustrates an example circuit diagram that supports features and operations in accordance with examples of the present disclosure.

FIG. 3 illustrates an example circuit 300 that supports periphery fill and localized capacitance in accordance with various embodiments of the present disclosure. Circuit 300 includes memory cell 305 that may include at least one selector device and a memory element formed in a container type common to an array that includes the memory cell. Circuit 300 may additionally include first switching component 310, memory element 315, second switching component 320, first access line 325, first electronic isolation 330, second access line 335, second electronic isolation 340, and capacitor 345. First access line 325 may include a first segment (not shown) and a second segment (not shown) and second access line 335 may include a first segment (not shown) and a second segment (not shown). First switching component 310 and second switching component 320 may be referred to as a first transistor and a second transistor, respectively, or a first TFT and second TFT, respectively. These various components may be examples of components as described with reference to FIGS. 1 and 2.

Memory cell 305 may be coupled with first access line 325 via first selector device 310. Memory element 315, located within memory cell 305, may be formed in a container type common to an array that includes memory cell 305. In some cases, memory element 315 may be a ferroelectric capacitor or a dielectric capacitor. In other examples, each memory cell 305 may include at least one memory element and each memory element of the array of memory cells may include a ferroelectric capacitor or a dielectric capacitor.

Capacitor 345 may represent a capacitor formed in the container type common to the array and coupled with the first access line 325. Capacitor 345 may be electrically isolated from the memory cell 305 and may represent a plurality of capacitors (e.g., capacitor 345) formed in the container type common to the array. Multiple capacitors may be coupled with the first access line 325 and each may be electrically isolated from memory cell 305. In some cases, capacitor 345 may be coupled with the first access line 325 via a first switching component 310 and a second switching component 320. In some cases, each capacitor of the plurality of capacitor may be formed in a same container type as each memory cell of the array of memory cells.

As previously mentioned, first switching component 310 and second switching component 320 may be transistors or TFTs. In some examples, the gate of each transistor (e.g., first switching component 310) may be coupled with a voltage source (not shown). In some examples, a gate of each of the first TFT and second TFT may be hardwired to a voltage source (not shown). A voltage may be applied to, for example, the first switching component 310 based on selecting memory cell 305. This may result in a charge on first access line 325. First switching component 310 may be a gate, where the voltage magnitude of the first access line may be greater than the threshold magnitude of the first switching component 310.

When a voltage is applied to first switching component 310, a charge corresponding to a logic "0" or a logic "1" may be stored at memory element 315. However, first electronic isolation 330 and second electronic isolation 340 may prevent the corresponding charge from being shared with capacitor 345. First electronic isolation 330 and second electronic isolation 340 may allow for multiple memory cells to be patterned into the periphery of a memory array (e.g., memory array 100 as described with reference to FIG. 1). In some examples, first electronic isolation 330 and second electronic isolation 340 may be formed via a chop mask. For example, first electronic isolation 330 may be formed via a chop mask, resulting in access line 325 being isolated into two or more segments. In some examples, a first segment of access line 325 may be coupled with memory cell 305 and a second segment of access line 325 may be coupled with capacitor 345. Electronic isolation 330 may result in memory cell 305 being electrically isolated from capacitor 345. In such examples, additional voltages may be applied to additional switching components, which may result in multiple logic values being stored in multiple patterned memory cells.

An additional memory cell (e.g., memory cell 305) may contain an additional memory element (e.g., memory element 315) formed in the container type common to the array and be coupled with the first access line 325 via an additional switching component. In some cases, each memory element may include a ferroelectric capacitor or a dielectric capacitor. In some cases, each capacitor of the plurality comprises a ferroelectric capacitor or a dielectric capacitor. Additionally, control circuitry (not shown) may be coupled to each of the memory cells (e.g., memory cell 305) and each of the capacitors (e.g., capacitor 345). Each memory cell may overlie the control circuitry.

Additionally, a memory controller (not shown) may be in electronic communication with each of the plurality of capacitors (e.g., capacitor 345). The memory controller may be operable to access a memory cell from an array of memory cells that is in electronic communication with a first access line and support circuitry. Memory controller may be further operable to capacitively couple a node in the support circuitry with at least one capacitor that is in electronic communication with the second segment of the first access line while accessing the memory cell, where the memory cell and the at least one capacitor are electrically isolated from one another, and where the at least one capacitor comprises and each of the memory cells comprise a same container type. In some examples, the capacitive coupling may include capacitively coupling the node (e.g., refining, processing, or filtering a voltage at a node) with at the at least one capacitor. In other examples, the capacitive coupling may include supplying a voltage to the node by the at least one capacitor. In other examples, the capacitive coupling may include charging the at least one capacitor via the node.

Figure 4:
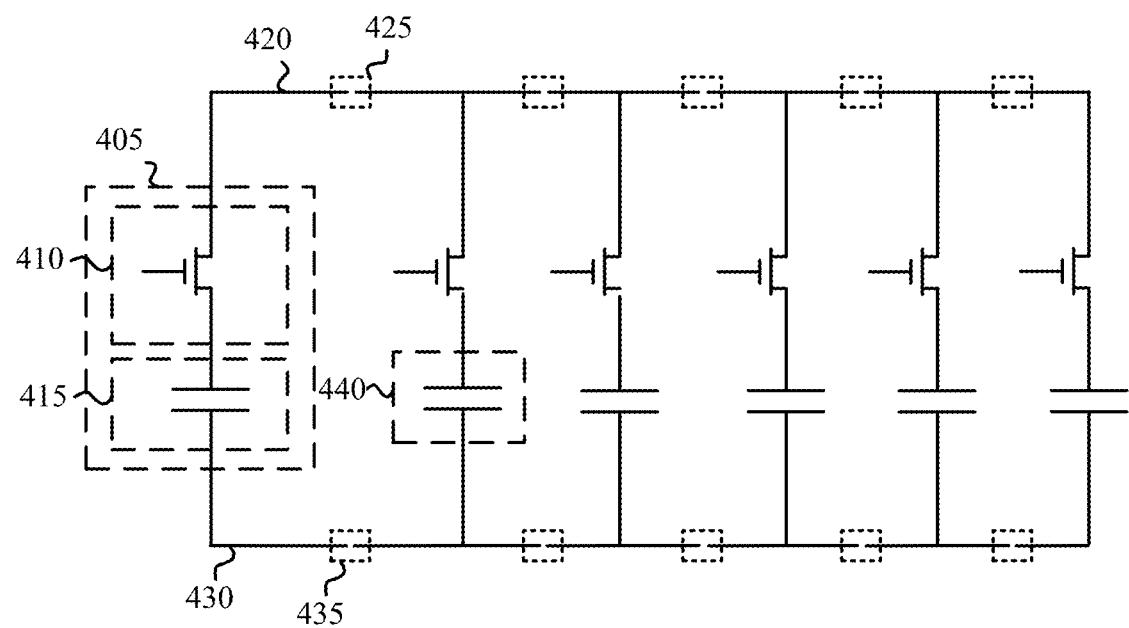
FIG. 4 illustrates an example circuit diagram that supports features and operations in accordance with examples of the present disclosure.

FIG. 4 illustrates an example circuit 400 that supports periphery fill and localized capacitance in accordance with various embodiments of the present disclosure. Circuit 400 includes memory cell 405 that may include at least one selector device and a memory element formed in a container type common to an array that includes the memory cell. Circuit 400 may additionally include first switching component 410, capacitor 415, first access line 420, first electronic isolation 425, second access line 430, second electronic isolation 435, and capacitor 440. First access line 420 may include a first segment (not shown) and a second segment (not shown) and second access line 430 may include a first segment (not shown) and a second segment (not shown). First switching component 410 may be referred to as a transistor or thin film transistor (TFT). These various components may be examples of components as described with reference to FIGS. 1 and 2.

Memory cell 405 may be coupled with first access line 420 via first switching component 410. Memory element, located within memory cell 405, may be formed in a container type common to an array that includes memory cell 405. In some cases, memory element may be a ferroelectric capacitor or a dielectric capacitor.

Capacitor 415 may represent a capacitor 415 formed in the container type common to the array and coupled with the first access line 420. Capacitor 415 may be electrically isolated from the memory cell 405 and may represent a plurality of capacitor 415 formed in the container type common to the array. Multiple capacitors 415 may be coupled with the first access line and each may be electrically isolated from memory cell 405. In some cases, capacitor 415 may be coupled with the first access line 420 via a first switching component and each capacitor 415 of the plurality may be coupled with the first access line 420 via an additional switching component. In some cases, each capacitor 415 of the plurality of capacitor 415 may be formed in a same container type as each memory cell of the array of memory cells.

As previously mentioned, first switching component 410 may be a transistor or a TFT. In some examples, the gate of the transistor (e.g., first switching component 410) may be coupled with a voltage source (not shown). In some examples, a gate of TFT may be hardwired to a voltage source. A voltage may be applied to first switching component 410 based on selecting memory cell 405. This may result in a charge on first access line 420 or second access line 430. First switching component 410 may be a gate, where the voltage magnitude of the first access line may be greater than the threshold magnitude of the first switching component 410.

When a voltage is applied to first switching component 410, a charge corresponding to a logic "0" or a logic "1" may be stored at capacitor 415. However, first electronic isolation 425 and second electronic isolation 435 may prevent the corresponding charge from being shared with capacitor 440. First electronic isolation 425 and second electronic isolation 435 may allow for multiple memory cells to be patterned into the periphery of a memory array (e.g., memory array 100 as described with reference to FIG. 1). In some examples, first electronic isolation 425 and second electronic isolation 435 may be formed via a chop mask. For example, first electronic isolation 425 may be formed via a chop mask, resulting in access line 420 being isolated into two or more segments. In some examples, a first segment of access line 420 may be coupled with memory cell 405 and a second segment of access line 420 may be coupled with capacitor 440. Electronic isolation 425 may result in memory cell 405 being electrically isolated from capacitor 440. In such an example, additional voltages may be applied to additional switching components, which may result in multiple logic values being stored in multiple patterned memory cells.

Additional memory cells 405 may each contain an additional memory element formed in the container type common to the array and be coupled with the first access line 420 via an additional switching component. In some cases, each memory element may include a ferroelectric capacitor or a dielectric capacitor. In some cases, each capacitor of the plurality comprises a ferroelectric capacitor or a dielectric capacitor. Additionally, control circuitry (not shown) may be coupled to each of the memory cells (e.g., memory cell 405) and each of the capacitors (e.g., capacitor 440). In some examples, control circuitry may be coupled to the array of memory cells and to the plurality of capacitors (e.g., capacitor 440), wherein the array of memory cells 405 and the plurality of capacitors overlie the control circuitry.

Additionally, a memory controller (not shown) may be in electronic communication with each of the plurality of capacitors (e.g., capacitor 440). The memory controller may be operable to access a memory cell from an array of memory cells that is in electronic communication with a first access line and support circuitry. Memory controller may be further operable to capacitively couple a node (e.g., filter a voltage at a node) in the support circuitry with at least one capacitor that is in electronic communication with the first access line while accessing the memory cell, where the memory cell and the at least one capacitor are electrically isolated from one another, and where the at least one capacitor comprises and the memory cell comprise a same container type.

Figure 5:
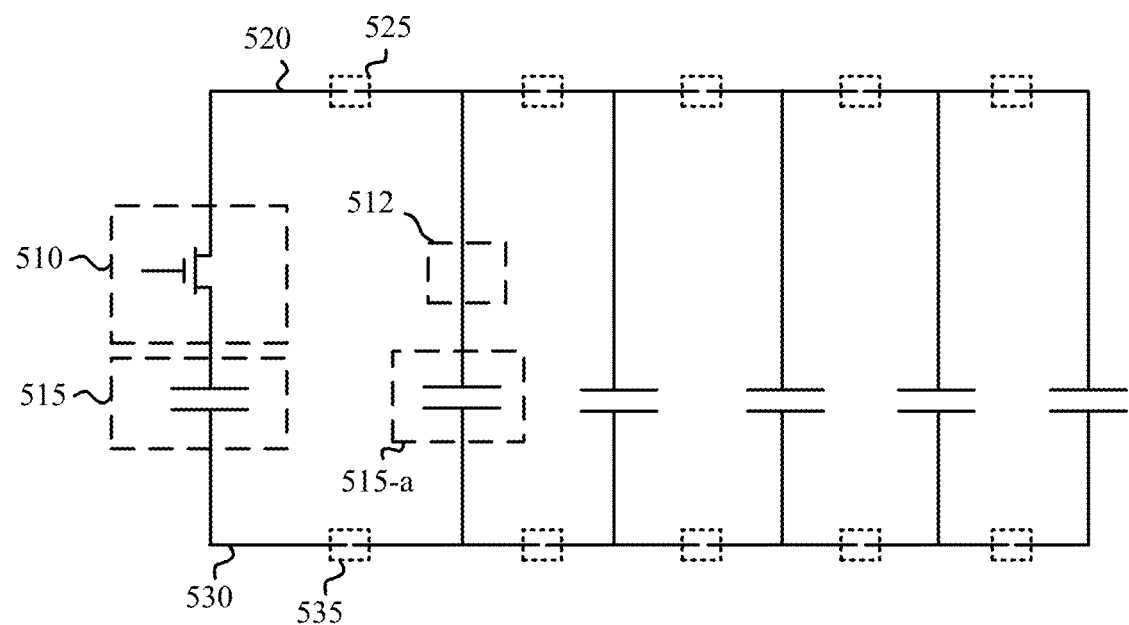
FIG. 5 illustrates an example circuit diagram that supports features and operations in accordance with examples of the present disclosure.

FIG. 5 illustrates an example circuit 500 that supports periphery fill and localized capacitance in accordance with various embodiments of the present disclosure. Circuit 500 includes at least one access component 510 and may include at least one capacitor 515, first access line 520, first electronic isolation 525, second access line 530, and second electronic isolation 530. First access line 520 may include a first segment (not shown) and a second segment (not shown) and second access line 530 may include a first segment (not shown) and a second segment (not shown). Access component 510 may be referred to as a switching component or as a transistor or TFT. These various components may be examples of components as described with reference to FIGS. 1 and 2.

Capacitor 515 may represent a capacitor 515 formed in the container type common to the array and coupled with the first access line 520. Capacitor 515 may be electrically isolated from an additional capacitor 515-a formed in the container type common to the array. Multiple capacitors 515 may be coupled with the first access line and each may be electrically isolated from each other. In some cases, capacitor 515-a may be coupled with the first access line 520 directly—i.e., via a short or shorted selection component 512. For example, selection component 512 may be an access device, such as a TFT, with the source and drain shorted or directly tied to one another.

As previously mentioned, access component 510 may be a transistor or a TFT. In some examples, the gate of the transistor (e.g., access component 510) may be coupled with a voltage source (not shown). In some examples, a gate of the TFT may be hardwired to a voltage source. In some examples, access component 510 may be shorted source to drain. A voltage may be applied to access component 510, which may result in a charge on first access line 520 or second access line 530.

When a voltage is applied to access component 510, a charge may be stored at capacitor 515. However, first electronic isolation 525 and second electronic isolation 535 may prevent the corresponding charge from being shared with capacitor 515-a. First electronic isolation 525 and second electronic isolation 535 may allow for multiple capacitors (e.g., capacitor 515-a) to be patterned into the periphery of a memory array (e.g., memory array 100 as described with reference to FIG. 1). In some examples, first electronic isolation 525 and second electronic isolation 535 may be formed via a chop mask. For example, first electronic isolation 525 may be formed via a chop mask, resulting in access line 520 being isolated into two or more segments. In some examples, a first segment of access line 520 may be coupled with capacitor 515 and a second segment of access line 520 may be coupled with capacitor 515-a. Electronic isolation 525 may result in capacitor 515 being electrically isolated from capacitor 515-a. In such an example, additional voltages may be applied to additional access components (e.g., access component 510-a), which may result in multiple charges being stored in multiple capacitors.

In some cases, each capacitor may be a ferroelectric capacitor or a dielectric capacitor. Additionally, control circuitry (not shown) may be coupled to each of the capacitors (e.g., capacitor 515). Each capacitor cell may overlie the control circuitry. Additionally, a memory controller (not shown) may be in electronic communication with each of the plurality of capacitors (e.g., capacitor 515). The memory controller may be operable to capacitively couple a node (e.g., filter a voltage at a node) in the support circuitry with at least one capacitor that is in electronic communication with the first access line.

Figure 6:
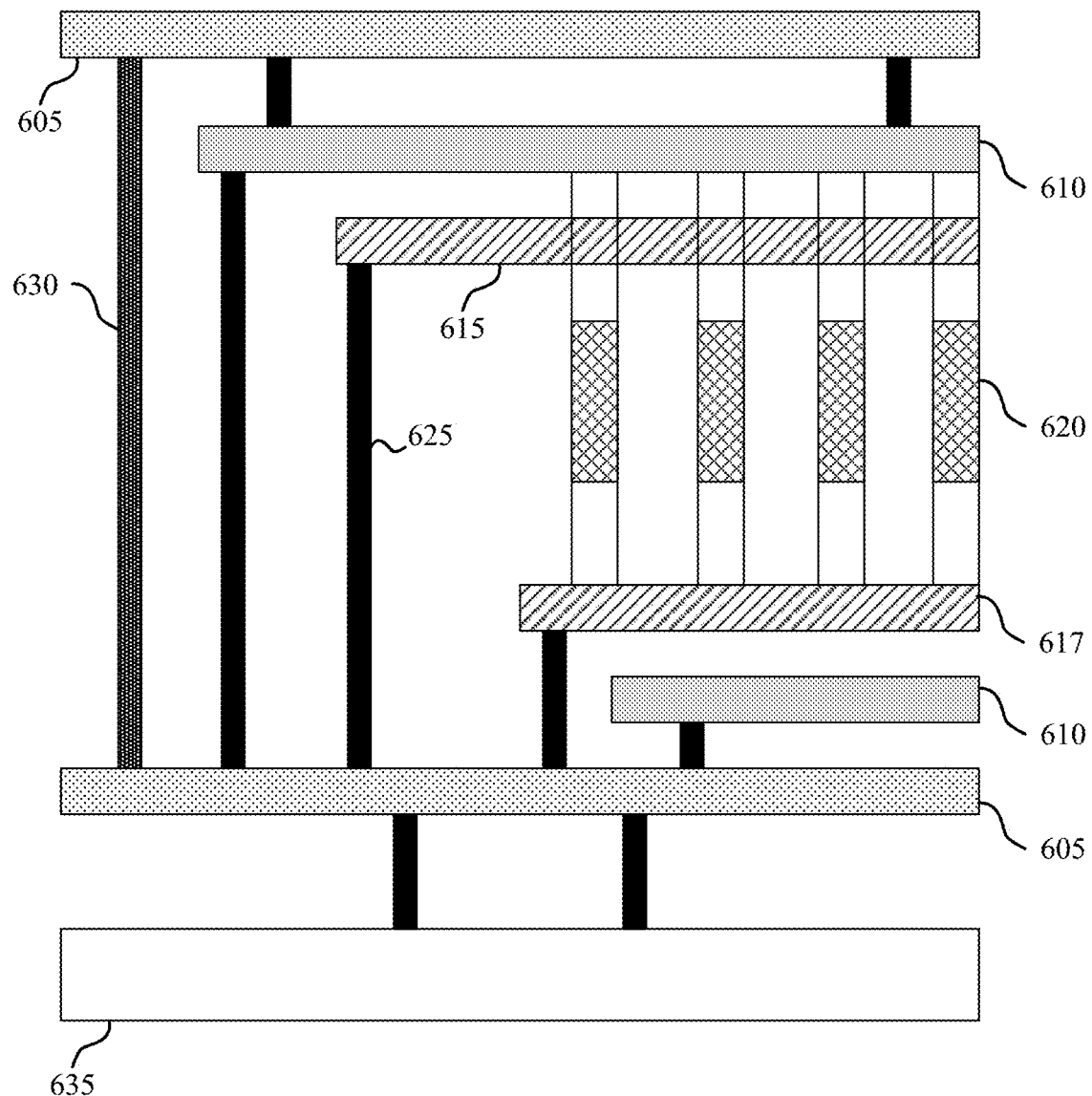
FIG. 6 illustrates an example memory device that supports features and operations in accordance with examples of the present disclosure.

FIG. 6 illustrates an example memory array 600 with periphery fill and localized capacitance in accordance with various embodiments of the present disclosure. Memory array 600 may be an example of memory array 100 as described with reference to FIG. 1 and may include metal lines 605, bit lines 610, access line 615, access line 617, containers 620, interconnects 625, contacts 630, and CMOS under array (CuA) 635. In some examples, interconnects 625 may be referred to as contacts 625 or vias 625. These various components may be examples of components as described with reference to FIGS. 1 through 5.

Bit lines 610 may be referred to as digit lines 610 and may be an example of digit lines 115 as described with reference to FIG. 1. Access line 615 may be referred to as word line 615 and may be an example of word lines 110 as described with reference to FIG. 1. In some examples, access line 617 may be referred to as plate line 617 and may be an example of plate line 210 as described with reference to FIG. 2. Operations may be performed on memory array 600 by activating or selecting bit lines 610, access line 615, and access line 617, which may include applying a voltage to the respective line. Metal lines 605 and interconnects 625 may facilitate access to bit lines 610, access line 615, and access line 617 and may be made of conductive materials such as metals (e.g., Silicon (Si), copper (Cu), aluminum (Al), gold (Au), tungsten (W), etc.), metal alloys, carbon, conductively-doped semiconductors, or other conductive materials, alloys, compounds, or the like.

Containers 620 may represent a container type common to the array as described with reference to FIGS. 3 through 5. Each container may be in electronic communication with or include a capacitor (e.g., capacitor 515 as described with reference to FIG. 5) and, in some examples, at least one access component (e.g., access component 510 as described with reference to FIG. 5), which may be referred to as a switching component or as a transistor or TFT. Each container 620 may be in electronic communication with bit lines 610, access line 615, and access line 617 via at least one access component. Containers 620 may include ferroelectric capacitors, dielectric capacitors, or paraelectric capacitors. Array 600 may be an array of FeRAM or DRAM or a combination of both.

When a voltage is applied to an access component, a charge may be stored a capacitor located within a container 620. Each container 620 may be electrically isolated via a first electronic isolation (not shown) and a second electronic isolation (not shown). The first electronic isolation and the second electronic isolation may be examples of first electronic isolation 525 as described with reference to FIG. 5 and second electronic isolation 535 as described with reference to FIG. 5, respectively. Because multiple capacitors may be coupled with bit lines 610, access line 615, and access line 617, first and second electronic isolation may prevent the corresponding charge from being shared with capacitors in multiple containers 620. Thus multiple capacitors may be patterned into the periphery of a memory array 600.

Containers 620 may overlie CuA 635. The CuA may underlie memory array 600 and include support circuitry. The support circuitry may support the capacitive coupling at a node (e.g., filtering of a voltage at a node) in the support circuitry with at least one capacitor that is in electronic communication with the first access line while accessing the memory cell. The memory cell and the at least one capacitor may be electrically isolated from one another and the at least one capacitor and the memory cell may include a same container type. CuA 635 may also facilitate the transfer of data via contacts 630. For example, contacts 630 may include at least sixty (60) individual contacts and may transfer data stored in the periphery of memory array 600 to metal lines 605.

Figure 7:
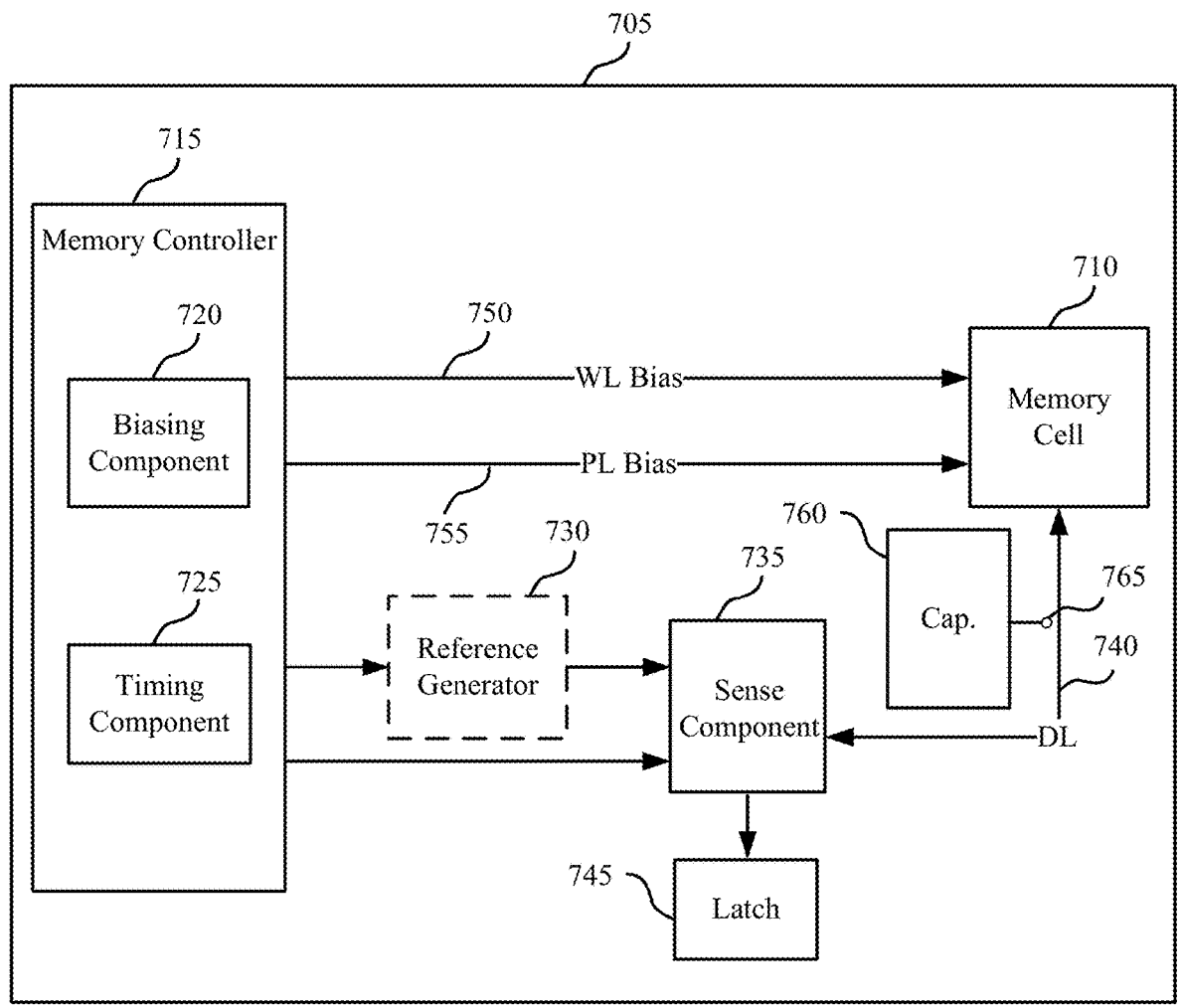
FIG. 7 illustrates an example memory device that supports features and operations in accordance with examples of the present disclosure.

FIG. 7 shows a block diagram 700 of a memory array 705 that supports periphery fill and localized capacitance in accordance with embodiments of the present disclosure. Memory array 705 may be referred to as an electronic memory apparatus, and may be an example of a component of a memory array 100 as described with reference to FIG. 1.

Memory array 705 may include one or more memory cells 710, a memory controller 715, a word line 750, a plate line 755 (e.g., plate line 210 as described with reference to FIG. 2 or access line 617 as described with reference to FIG. 6), a reference generator 730, a sense component 735, a digit line 740, a latch 745, a capacitor or capacitors 760, and a node 765. These components may be in electronic communication with each other and may perform one or more of the functions described herein. In some cases, memory controller 715 may include biasing component 720 and timing component 725. In some cases, sense component 735 may serve as the reference generator 730. In other cases, reference generator 730 may be optional.

Memory controller 715 may be in electronic communication with word line 750, digit line 740, sense component 735, and plate line 755, which may be examples of word line 110, digit line 115, sense component 125, and plate line 210 described with reference to FIGS. 1 and 2 or access line 617 as described with reference to FIG. 6. Memory array 705 may also include reference generator 730 and latch 745. The components of memory array 705 may be in electronic communication with each other and may perform aspects of the functions described with reference to FIGS. 1 through 4. In some cases, reference generator 730, sense component 735, and latch 745 may be components of memory controller 715.

In some examples, digit line 740 is in electronic communication with sense component 735 and a ferroelectric capacitor of ferroelectric memory cells 710. A ferroelectric memory cell 710 may be writable with a logic state (e.g., a first or second logic state). In some examples, capacitor 760 may be in electronic communication with digit line 740. In other examples, capacitor 760 may be in electronic communication with one or more additional circuits (not shown). Capacitor 760 may be, for example, formed in the container type common to the array and may be electrically isolated from memory cells 710. Additionally or alternatively, for example, a voltage may be capacitively coupled (e.g., filtered) at node 765 with at least one capacitor (e.g., capacitors 760) that is in electronic communication with the first access line while accessing the memory cell (e.g., memory cell 710).

Word line 750 may be in electronic communication with memory controller 715 and a selection component of ferroelectric memory cell 710. Plate line 755 may be in electronic communication with memory controller 715 and a plate of the ferroelectric capacitor of ferroelectric memory cell 710. Sense component 735 may be in electronic communication with memory controller 715, digit line 740, latch 745, and reference line (not shown). Reference generator 730 may be in electronic communication with memory controller 715 and reference line (not shown). Sense control line (not shown) may be in electronic communication with sense component 735 and memory controller 715. These components may also be in electronic communication with other components, both inside and outside of memory array 705, in addition to components not listed above, via other components, connections, or busses.

Memory controller 715 may be configured to activate word line 750, plate line 755, or digit line 740 by applying voltages to those various nodes. For example, biasing component 720 may be configured to apply a voltage to operate memory cell 710 to read or write memory cell 710 as described above. In some cases, memory controller 715 may include a row decoder, column decoder, or both, as described with reference to FIG. 1. This may enable memory controller 715 to access one or more memory cells 105. Biasing component 720 may also provide voltage potentials to reference generator 730 in order to generate a reference signal for sense component 735. Additionally, biasing component 720 may provide voltage potentials for the operation of sense component 735.

In some cases, memory controller 715 may perform its operations using timing component 725. For example, timing component 725 may control the timing of the various word line selections or plate biasing, including timing for switching and voltage application to perform the memory functions, such as reading and writing, discussed herein. In some cases, timing component 725 may control the operations of biasing component 720.

Reference generator 730 may include various components to generate a reference signal for sense component 735, reference generator 730 may include circuitry configured to produce a reference signal. In some cases, reference generator 730 may be implemented using other ferroelectric memory cells 105. Sense component 735 may compare a signal from memory cell 710 (through digit line 740) with a reference signal from reference generator 730. Upon determining the logic state, the sense component may then store the output in latch 745, where it may be used in accordance with the operations of an electronic device that memory array 705 is a part. Sense component 735 may include a sense amplifier in electronic communication with the latch and the ferroelectric memory cell.

Memory controller 715 and/or at least some of its various sub-components may be implemented in hardware, software executed by a processor, firmware, or any combination thereof. If implemented in software executed by a processor, the functions of the memory controller 715 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The memory controller 715 and/or at least some of its various sub-components may be physically located at various positions, including being distributed such that portions of functions are implemented at different physical locations by one or more physical devices. In some examples, memory controller 715 and/or at least some of its various sub-components may be a separate and distinct component in accordance with various embodiments of the present disclosure. In other examples, memory controller 715 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

Memory controller 715 may access a memory cell from an array of memory cells that is in electronic communication with a first access line. Additionally, for example, memory controller 715 may capacitively couple (e.g., filter a voltage) node 765 in support circuitry with at least one capacitor 760 that is in electronic communication with the first access line while accessing the memory cell 710. The memory cell 710 and the at least one capacitor 760 may be electrically isolated from one another and the at least one capacitor and the memory cell may include a same container type.

Additionally or alternatively, for example, memory controller 715 may select a first selector device that is coupled between the memory cell and the first access line. Memory controller 715 may also select a second selector device that is coupled between the memory cell and a second access line. The at least one capacitor may be in electronic communication with a second segment of the first access line and a second segment of the second access line. In some examples, memory controller 715 may select a selector device that is coupled between the at least one capacitor and the first access line. The capacitive coupling may be based at least in part on selecting the selector device. In additional examples, memory controller 715 may select an additional selector device that is coupled between the at least one capacitor and a second access line. The capacitive coupling may be based at least in part on selecting the additional selector device.

Memory controller 715 may include means for accessing a memory cell from an array of memory cells that is in electronic communication with a first access line and support circuitry. Additionally, memory controller 715 may include means for capacitively coupling (e.g., filtering) a node in the support circuitry with at least one capacitor that is in electronic communication with the first access line while accessing the memory cell, wherein the memory cell and the at least one capacitor are electrically isolated from one another, and where the at least one capacitor comprises and the memory cell comprise a same container type.

In some examples of the method and apparatus described above, memory controller 715 may include means for selecting a first selector device that may be coupled between the memory cell and the first access line. Some examples of the method and apparatus described above may further include processes, features, means, or instructions for selecting a second selector device that may be coupled between the memory cell and a second access line, wherein the at least one capacitor may be in electronic communication with the first access line and the second access line.

Some examples of the method and apparatus described above may further include processes, features, means, or instructions for selecting a selector device that may be coupled between the at least one capacitor and the first access line, wherein the capacitive coupling (e.g., filtering) may be based at least in part on selecting the selector device.

Additionally, examples of the method and apparatus described above may include processes, features, means, or instructions for selecting an additional selector device that may be coupled between the at least one capacitor and a second access line, wherein the capacitive coupling (e.g., filtering) may be based at least in part on selecting the additional selector device.

Figure 8:
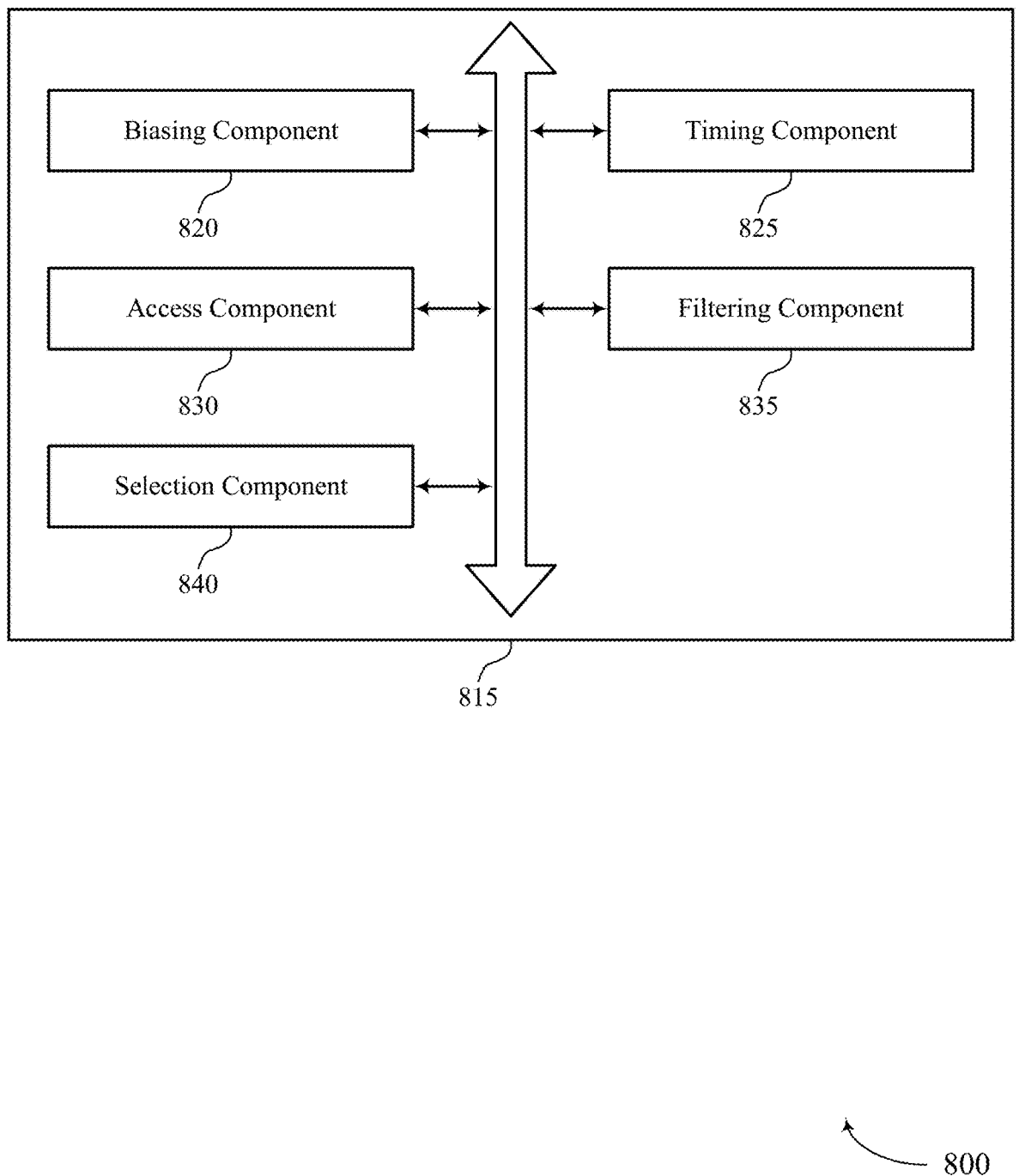
FIG. 8 illustrates a block diagram of a system that supports features and operations in accordance with examples of the present disclosure.

FIG. 8 shows a block diagram 800 of a memory controller 815 that supports periphery fill and localized capacitance in accordance with embodiments of the present disclosure. The memory controller 815 may be an example of aspects of a memory controller 715 described with reference to FIG. 7. The memory controller 815 may include biasing component 820, timing component 825, access component 830, filtering component 835, and selection component 840. In some examples, filtering component 835 may include a capacitive component (not illustrated). Each of these components may communicate, directly or indirectly, with one another (e.g., via one or more buses). In some examples, these components may be software modules executable by controller 815.

Biasing component 820 or timing component 825 may cause controller 815 to implement operations similar to those described with reference to biasing component 720 of FIG. 7 and timing component 725 of FIG. 7, respectively.

Access component 830 may cause controller 815 to implement operations to access a memory cell from an array of memory cells that is in electronic communication with a first access line and support circuitry. In some examples, accessing the memory cell may include selecting a first selector device that is coupled between a memory cell (e.g., memory cell 305 as described with reference to FIG. 3) and a first access line (e.g., first access line 325 as described with reference to FIG. 3).

Filtering component 835 may cause controller 815 to implement operations to capacitively couple a node (e.g., filter a voltage at a node) in the support circuitry with at least one capacitor (e.g., capacitor 345 as described with reference to FIG. 3) that is in electronic communication with a first access line (e.g., first access line 325 as described with reference to FIG. 3) while accessing the memory cell (e.g., memory cell 305 as described with reference to FIG. 3). In some examples, filtering component 835 may cause controller 815 to capacitively couple a node in the support circuity where the memory cell and the at least one capacitor are electrically isolated from one another, and where the at least one capacitor includes and the memory cell include a same container type.

Selection component 840 may cause controller 815 to implement operations to select a second selector device that is coupled between the memory cell (e.g., memory cell 305 as described with reference to FIG. 3) and a second access line (e.g., second access line 335 as described with reference to FIG. 3). In some examples, selection component 840 may cause controller 815 to select a second selector device that is coupled between the memory cell where the at least one capacitor (e.g., capacitor 345 as described with reference to FIG. 3) is in electronic communication with a first access line (e.g., first access line 325 as described with reference to FIG. 3) and the second access line. In some examples, selection component 840 may cause controller 815 to select a selector device that is coupled between the at least one capacitor and the first access line, where the capacitive coupling is based on selecting the selector device. In some examples, selection component 840 may cause controller 815 to select an additional selector device that is coupled between the at least one capacitor and a second access line, where capacitive coupling is based on selecting the additional selector device.

Figure 9:
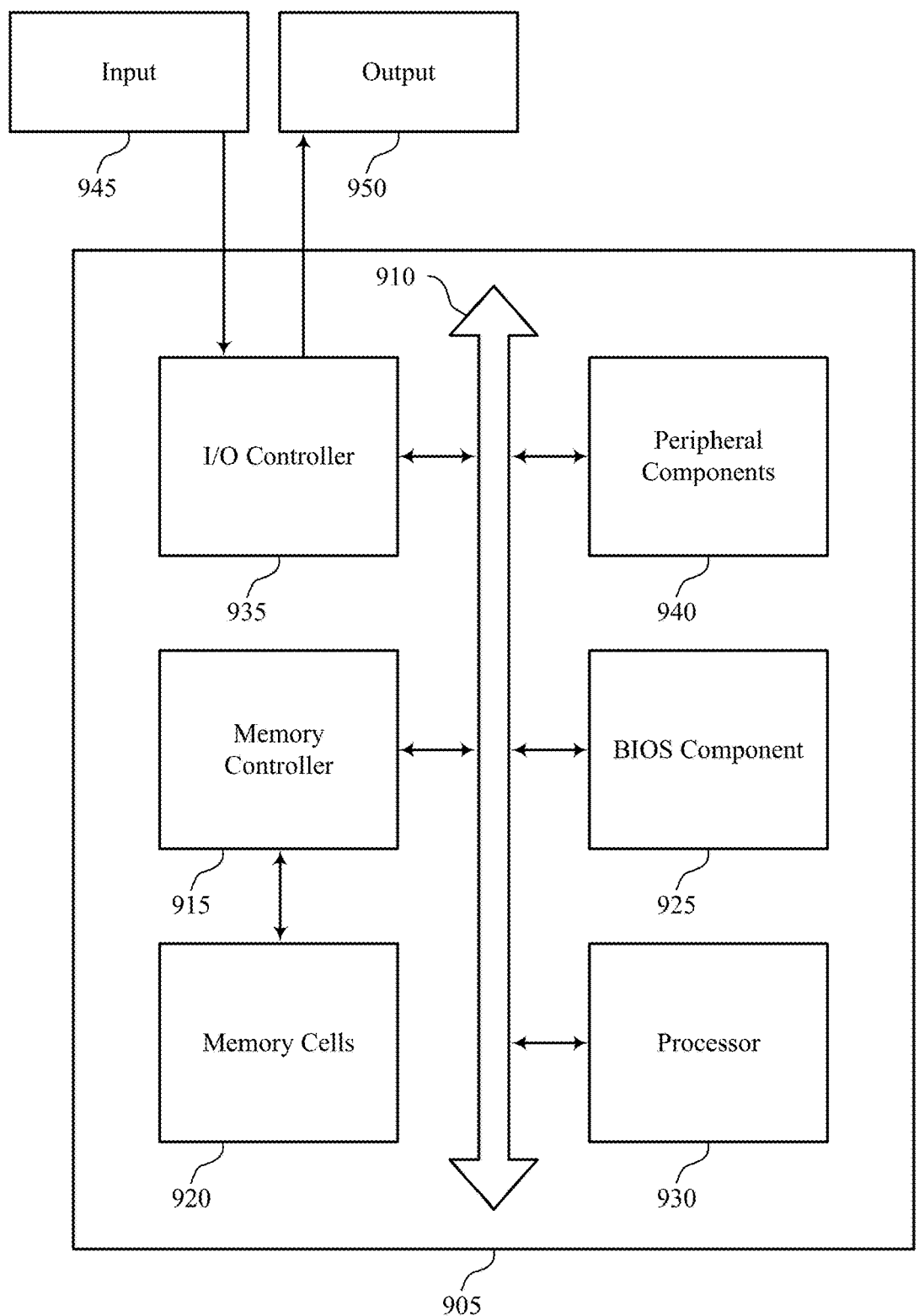
FIG. 9 illustrates a block diagram of a device that supports features and operations in accordance with examples of the present disclosure.

FIG. 9 shows a diagram of a system 900 including a device 905 that supports periphery fill and localized capacitance in accordance with embodiments of the present disclosure. Device 905 may be an example of or include the components of memory array 100 as described above, e.g., as described with reference to FIG. 1. Device 905 may include components for bi-directional voice and data communications including components for transmitting and receiving communications, including memory controller 915, memory cells 920, basic input/output system (BIOS) component 925, processor 930, I/O controller 935, and peripheral components 940. These components may be in electronic communication via one or more busses (e.g., bus 910).

Memory controller 915 may operate one or more memory cells as described herein. Specifically, memory controller 915 may be configured to support periphery fill and localized capacitance. In some cases, memory controller 915 may include a row decoder, column decoder, or both, as described with reference to FIG. 1 (not shown).

Memory cells 920 may store information (i.e., in the form of a logical state) as described herein. Additionally, for example, each memory cell 920 may include a selector device and a memory element formed in a container type common to an array that includes each memory cell 920.

BIOS component 925 may be a software component that includes BIOS operated as firmware, which may initialize and run various hardware components. BIOS component 925 may also manage data flow between a processor and various other components, e.g., peripheral components, input/output control component, etc. BIOS component 925 may include a program or software stored in read only memory (ROM), flash memory, or any other non-volatile memory.

Processor 930 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 930 may be configured to operate a memory array using a memory controller. In other cases, a memory controller may be integrated into processor 930. Processor 930 may be configured to execute computer-readable instructions stored in a memory to perform various functions (e.g., functions or tasks supporting periphery fill and localized capacitance).

I/O controller 935 may manage input and output signals for device 905. I/O controller 935 may also manage peripherals not integrated into device 905. In some cases, I/O controller 935 may represent a physical connection or port to an external peripheral. In some cases, I/O controller 935 may utilize an operating system such as iOS®, ANDROID®, MS-DOS®, MS-WINDOWS®, OS/2®, UNIX®, LINUX®, or another known operating system. In other cases, I/O controller 935 may represent or interact with a modem, a keyboard, a mouse, a touchscreen, or a similar device. In some cases, I/O controller 935 may be implemented as part of a processor. In some cases, a user may interact with device 905 via I/O controller 935 or via hardware components controlled by I/O controller 935.

Peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 945 may represent a device or signal external to device 905 that provides input to device 905 or its components. This may include a user interface or an interface with or between other devices. In some cases, input 945 may be managed by I/O controller 935, and may interact with device 905 via a peripheral component 940.

Output 950 may also represent a device or signal external to device 905 configured to receive output from device 905 or any of its components. Examples of output 950 may include a display, audio speakers, a printing device, another processor or printed circuit board, etc. In some cases, output 950 may be a peripheral element that interfaces with device 905 via peripheral component(s) 940. In some cases, output 950 may be managed by I/O controller 935

The components of device 905 may include circuitry designed to carry out their functions. This may include various circuit elements, for example, conductive lines, transistors, capacitors, inductors, resistors, amplifiers, or other active or inactive elements, configured to carry out the functions described herein. Device 905 may be a computer, a server, a laptop computer, a notebook computer, a tablet computer, a mobile phone, a wearable electronic device, a personal electronic device, or the like. Or device 905 may be a portion or aspect of such a device.

Figure 10:
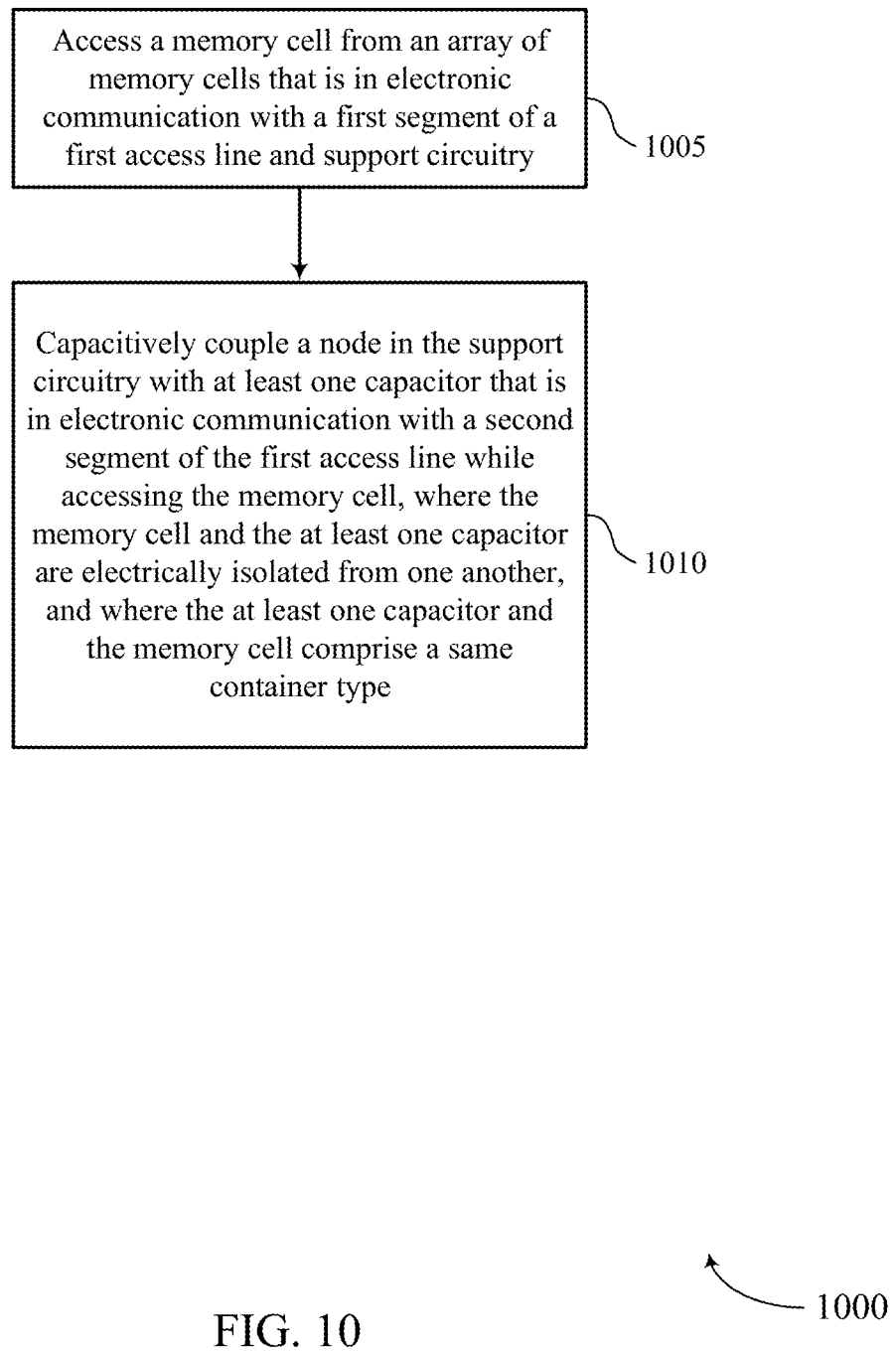
FIG. 10 is a flowchart that illustrates a method or methods for operating a memory device that supports periphery fill and localized capacitance in accordance with examples of the present disclosure.

FIG. 10 shows a flowchart illustrating a method 1000 for periphery fill and localized capacitance in accordance with embodiments of the present disclosure. The operations of method 1000 may be implemented by a memory array 100 or its components as described herein. For example, the operations of method 1000 may be performed by a memory controller as described with reference to FIGS. 7 through 9. In some examples, a memory array 100 may execute a set of codes to control the functional elements of the device to perform the functions described below. Additionally or alternatively, the memory array 100 may perform aspects of the functions described below using special-purpose hardware.

At block 1005 the memory array 100 may access a memory cell from an array of memory cells that is in electronic communication with a first segment of a first access line and support circuitry. The operations of block 1005 may be performed according to the methods described with reference to FIG. 1 through FIG. 7. In certain examples, aspects of the operations of block 1005 may be performed by a memory cell as described with reference to FIG. 7 through FIG. 9.

At block 1010 the memory array 100 may capacitively couple a node in the support circuitry with at least one capacitor that is in electronic communication with a second segment of the first access line while accessing the memory cell, wherein the memory cell and the at least one capacitor are electrically isolated from one another, and wherein the at least one capacitor and the memory cell comprise a same container type. The memory cell and the at least one capacitor may be electrically isolated from each other and the at least one capacitor may and the memory cell may include a same container type. The operations of block 1010 may be performed according to the methods described with reference to FIG. 1 through FIG. 7. In certain examples, aspects of the operations of block 1010 may be performed by a voltage node as described with reference to FIG. 7 through FIG. 9.

In some cases, accessing the memory cell may include selecting a first selector device that is coupled between the memory cell and the first segment of the first access line. Additionally, for example, the method may include selecting a second selector device that is coupled between the memory cell and a first segment of a second access line. The at least one capacitor may be in electronic communication with the first access line and the second access line.

In some cases, the method may also include selecting a selector device that is coupled between the at least one capacitor and the second segment of the first access line. The capacitive coupling (e.g., filtering) may be based at least in part on selecting the selector device. In additional examples, the method may include selecting an additional selector device that is coupled between the at least one capacitor and a first segment of a second access line. The capacitive coupling (e.g., filtering) may be based at least in part on selecting the additional selector device. In other examples, the capacitive coupling of the node in the support circuitry with the at least one capacitor may include filtering a voltage at the node in the support circuitry with the at least one capacitor that is in electronic communication with the second segment of the first access line.

It should be noted that the methods described above describe possible implementations, and that the operations and the steps may be rearranged or otherwise modified and that other implementations are possible. Further, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "isolated" or "electrically isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
   an array of memory cells that is coupled with a first access line;
   a plurality of capacitors each coupled with a plurality of segments of the first access line and each isolated from each memory cell of the array of memory cells; and
   circuitry coupled to the array of memory cells and the plurality of capacitors, wherein the array of memory cells and the plurality of capacitors overlie the circuitry.

2. The memory device of claim 1, wherein each capacitor of the plurality of capacitors is coupled with one of the plurality of segments of the first access line via a first switching component and each memory cell of the array of memory cells comprises a second switching component.

3. The memory device of claim 2, wherein each of the first switching component and the second switching component comprises a thin-film transistor (TFT).

4. The memory device of claim 3, wherein a gate of each TFT coupled between one of the plurality of capacitors and the first access line is hardwired to a voltage source.

5. The memory device of claim 1, wherein each capacitor of the plurality of capacitors is formed in a same container type as each memory cell of the array of memory cells.

6. The memory device of claim 1, wherein at least one memory cell of the array of memory cells and each capacitor of the plurality of capacitors is coupled with a second access line.

7. The memory device of claim 6, wherein each memory cell coupled with the second access line comprises a memory element, a first transistor, and a second transistor, and wherein each memory element is in electronic communication with a first segment of the first access line via the first transistor and a second segment of the second access line via the second transistor.

8. The memory device of claim 1, wherein each memory cell comprises at least one memory element and each memory element of the array of memory cells comprises a ferroelectric capacitor or a dielectric capacitor.

9. The memory device of claim 1, wherein each of the plurality of capacitors comprises a ferroelectric capacitor or a dielectric capacitor.

10. An apparatus, comprising:
    a memory cell that comprises a memory element coupled with a selector device that is coupled with a first access line segment, and wherein the memory element is coupled with a second access line segment, the memory cell formed in a container type common to the memory cell;
    a capacitor formed in the container type common to the memory cell and electrically isolated from the memory cell, wherein the capacitor is coupled with a third access line segment and a fourth access line segment; and
    a plurality of additional capacitors each formed in the container type common to the memory cell and electrically isolated from the memory cell, wherein each capacitor of the plurality of additional capacitors is coupled with a respective access line segment that is colinear with the first access line segment and the third access line segment.

11. The apparatus of claim 10, wherein each of the plurality of additional capacitors is coupled with the respective access line segment via a respective transistor.

12. The apparatus of claim 11, wherein each capacitor of the plurality of additional capacitors is configured to store a charge independent from each other capacitor of the plurality of additional capacitors, and wherein each of the respective transistors is independently controllable.

13. The apparatus of claim 10, wherein the first access line segment and the third access line segment are formed from a common access line.

14. The apparatus of claim 10, wherein the memory cell comprises a ferroelectric memory cell, and wherein the capacitor comprises a linear capacitor.

* * * * *